US010530296B2

(12) United States Patent
Jabrucki et al.

(10) Patent No.: US 10,530,296 B2
(45) Date of Patent: Jan. 7, 2020

(54) OSCILLATOR TEMPERATURE COEFFICIENT ADJUSTMENT

(71) Applicant: Synaptics Incorporated, San Jose, CA (US)

(72) Inventors: Andrew Jabrucki, San Jose, CA (US); Eric Bohannon, San Jose, CA (US); Kevin Fronczak, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 183 days.

(21) Appl. No.: 15/885,769

(22) Filed: Jan. 31, 2018

(65) Prior Publication Data

US 2019/0238091 A1 Aug. 1, 2019

(51) Int. Cl.
*H03B 5/04* (2006.01)
*H03B 5/24* (2006.01)
*G06F 3/041* (2006.01)
*G06F 3/044* (2006.01)

(52) U.S. Cl.
CPC ............ *H03B 5/04* (2013.01); *G06F 3/044* (2013.01); *G06F 3/0416* (2013.01); *H03B 5/24* (2013.01); *G06F 2203/04101* (2013.01)

(58) Field of Classification Search
CPC .... H03B 5/04; H03B 5/24; G06F 2203/04101
See application file for complete search history.

(56) References Cited

U.S. PATENT DOCUMENTS 5,357,220 A * 10/1994 Francis ............... H03K 3/2821
                                                 331/113 R
2009/0015319 A1 * 1/2009 Tzeng ..................... H03K 3/03
                                                 327/537

OTHER PUBLICATIONS

Antonio Buonomo et al., "Analysis of Emitter (Source)-Coupled Multivibrators", IEEE Transactions on Circuits and Systems I: Regular Papers, vol. 53, Issue: 6, Jun. 19, 2006 (10 pages).

* cited by examiner

*Primary Examiner* — Jeffrey M Shin
(74) *Attorney, Agent, or Firm* — Ferguson Braswell Fraser Kubasta PC

(57) ABSTRACT

An oscillator circuit is disclosed. The oscillator circuit includes: oscillator transistors including gates; adjustment transistors coupled to the gates; a differential output coupled to the oscillator transistors; a switch configured to set an oscillation frequency of the differential output by driving: a first current including a first portion of a main current through at least one of the oscillator transistors; and a second current including a second portion of the main current through at least one of the adjustment transistors; a first set of auxiliary current sources configured to adjust a temperature coefficient of the oscillator circuit by driving a first set of auxiliary currents through the oscillator transistors; and a second set of auxiliary current sources configured to maintain the oscillation frequency of the differential output by driving, in response to driving the first set of auxiliary currents, a second set of auxiliary currents though the adjustment transistors.

20 Claims, 5 Drawing Sheets

OSCILLATOR TEMPERATURE COEFFICIENT ADJUSTMENT

TECHNICAL FIELD

The described embodiments relate generally to electronic devices, and more specifically, to an oscillator circuit with an adjustable temperature coefficient.

BACKGROUND

Input devices, including proximity sensor devices (e.g., touchpads or touch sensor devices), are widely used in a variety of electronic systems. A proximity sensor device may include a sensing region, often demarked by a surface, in which the proximity sensor device determines the presence, location and/or motion of one or more input objects. Proximity sensor devices may be used to provide interfaces for the electronic system. For example, proximity sensor devices may be used as input devices for larger computing systems (e.g., opaque touchpads integrated in, or peripheral to, notebook or desktop computers). Proximity sensor devices are also often used in smaller computing systems (e.g., touch screens integrated in cellular phones). Proximity sensor devices may also be used to detect input objects (e.g., finger, styli, pens, fingerprints, etc.).

Many electronic devices, including input devices, may be expected to operate over a wide range of temperatures. Oscillators are often used to provide clock signals. However, oscillation frequency can be affected by temperature changes, thereby affecting the clock signals. Accordingly, it may be desirable for the electronic devices to include circuitry that provides a stable oscillation frequency over the wide range of temperatures.

SUMMARY

In general, in one aspect, one or more embodiments are related to an oscillator circuit. The oscillator circuit comprises: a plurality of oscillator transistors comprising a plurality of gates; a plurality of adjustment transistors coupled to the plurality of gates; a differential output coupled to the plurality of oscillator transistors; a switch configured to set an oscillation frequency of the differential output by driving: a first current comprising a first portion of a main current through at least one of the plurality of oscillator transistors; and a second current comprising a second portion of the main current through at least one of the plurality of adjustment transistors; a first set of auxiliary current sources configured to adjust a temperature coefficient of the oscillator circuit by driving a first set of auxiliary currents through the plurality of oscillator transistors; and a second set of auxiliary current sources configured to maintain the oscillation frequency of the differential output by driving, in response to driving the first set of auxiliary currents, a second set of auxiliary currents though the plurality of adjustment transistors.

In general, in one aspect, one or more embodiments are related to a method for operating an oscillator circuit. The method comprises: setting an oscillation frequency of a differential output by adjusting a switch that drives: a first current comprising a first portion of a main current through at least one of a plurality of oscillator transistors; and a second current comprising a second portion of the main current through at least one of a plurality of adjustment transistors; adjusting a temperature coefficient of the oscillator circuit by driving a first set of auxiliary currents through the plurality of oscillator transistors; and maintaining the oscillation frequency of the differential output by driving, in response to driving the first set of auxiliary currents, a second set of auxiliary currents though the plurality of adjustment transistors.

In general, in one aspect, one or more embodiments are related to an input device. The input device comprises: an oscillator circuit comprising: a plurality of oscillator transistors comprising a plurality of gates; a plurality of adjustment transistors coupled to the plurality of gates; a differential output coupled to the plurality of oscillator transistors; a switch configured to set an oscillation frequency of the differential output by driving: a first current comprising a first portion of a main current through at least one of the plurality of oscillator transistors; and a second current comprising a second portion of the main current through at least one of the plurality of adjustment transistors; a first set of auxiliary current sources configured to adjust a temperature coefficient of the oscillator circuit by driving a first set of auxiliary currents through the plurality of oscillator transistors; and a second set of auxiliary current sources configured to maintain the oscillation frequency of the differential output by driving, in response to driving the first set of auxiliary currents, a second set of auxiliary currents though the plurality of adjustment transistors; and circuitry configured to operate, based on at least the differential output of the oscillator circuit, a plurality of sensor electrodes during capacitive sensing.

Other aspects of the embodiments will be apparent from the following description and the appended claims.

BRIEF DESCRIPTION OF DRAWINGS

The present embodiments are illustrated by way of example and are not intended to be limited by the figures of the accompanying drawings.

DETAILED DESCRIPTION

The following detailed description is merely exemplary in nature, and is not intended to limit the invention or the application and uses of the invention. Furthermore, there is no intention to be bound by any expressed or implied theory presented in the preceding technical field, background, brief summary or the following detailed description.

In the following detailed description of embodiments, numerous specific details are set forth in order to provide a more thorough understanding of the disclosed technology. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Various embodiments disclose input devices and methods that facilitate improved usability. Specifically, one or more embodiments disclose an oscillator circuit with a temperature coefficient that can be adjusted (e.g., reduced). By reducing the temperature coefficient, the output oscillation frequency of the oscillator circuit remains relatively stable over a wide range of temperatures.

Figure 1:
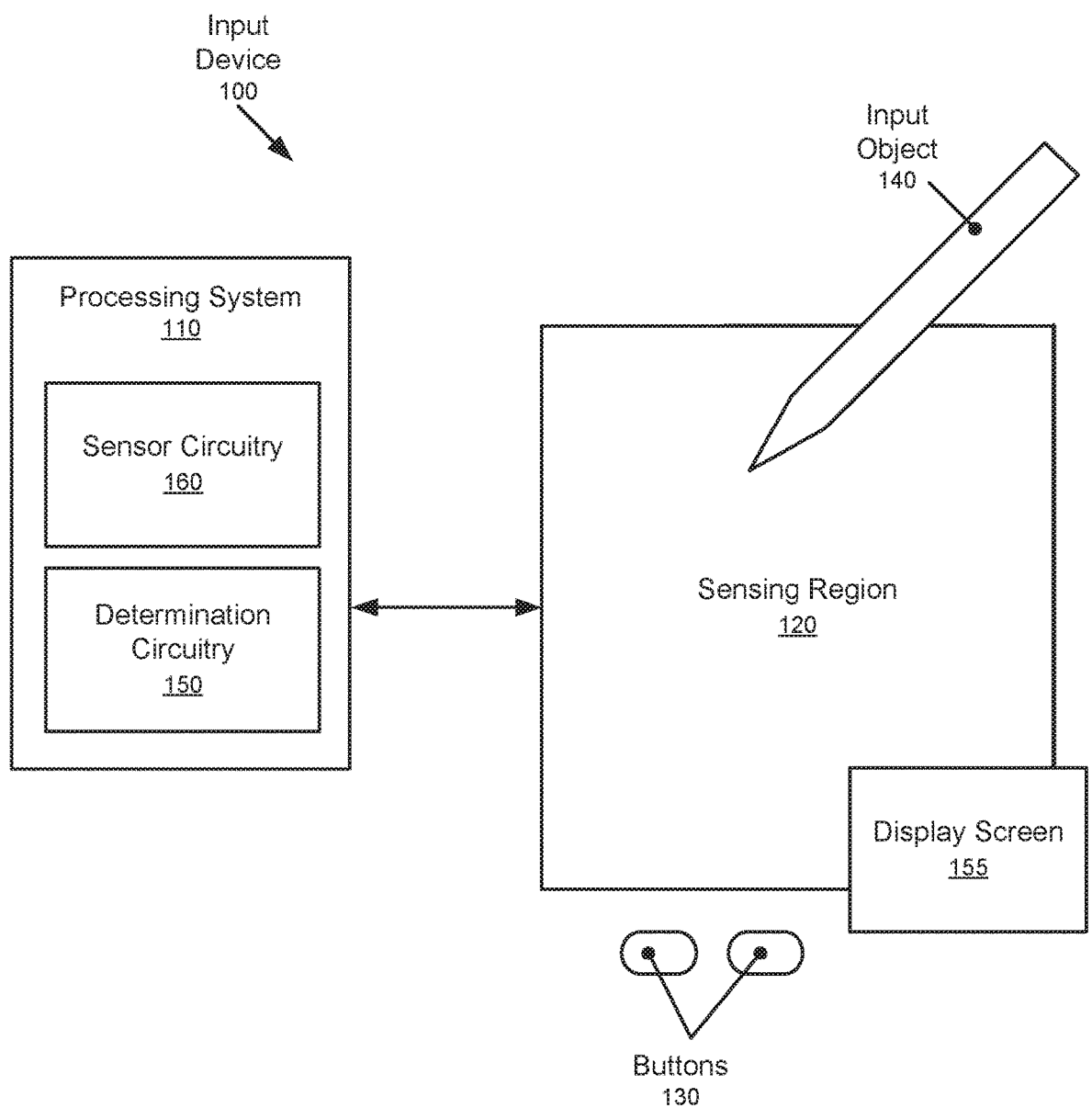
FIG. 1 shows a block diagram of an input device in accordance with one or more embodiments.

Turning now to the figures, FIG. 1 shows a block diagram of an exemplary input device (100), in accordance with embodiments of the disclosure. The input device (100) may be configured to provide input to an electronic system (not shown for simplicity). As used in this document, the term "electronic system" (or "electronic device") broadly refers to any system capable of electronically processing information. Examples of electronic systems may include personal computers of all sizes and shapes (e.g., desktop computers, laptop computers, netbook computers, tablets, web browsers, e-book readers, and personal digital assistants (PDAs)), composite input devices (e.g., physical keyboards, joysticks, and key switches), data input devices (e.g., remote controls and mice), data output devices (e.g., display screens and printers), remote terminals, kiosks, video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). Additionally, the electronic system could be a host or a slave to the input device.

The input device (100) may be implemented as a physical part of the electronic system. In the alternative, the input device (100) may be physically separate from the electronic system. The input device (100) may be coupled to (and communicate with) components of the electronic system using various wired or wireless interconnections and communication technologies, such as buses and networks. Example technologies may include Inter-Integrated Circuit (I2C), Serial Peripheral Interface (SPI), PS/2, Universal Serial Bus (USB), Bluetooth®, Infrared Data Association (IrDA), and various radio frequency (RF) communication protocols defined by the IEEE 802.11 or other standards.

In the example of FIG. 1, the input device (100) may correspond to a proximity sensor device (such as a "touchpad" or a "touch sensor device") configured to sense input provided by one or more input objects (140) in a sensing region (120). Example input objects include fingers and styli. The sensing region (120) may encompass any space above, around, in and/or near the input device (100) in which the input device (100) is able to detect user input (e.g., provided by one or more input objects (140)). The sizes, shapes, and locations of particular sensing regions may vary depending on actual implementations.

In some embodiments, the sensing region (120) detects inputs involving no physical contact with any surfaces of the input device (100). In other embodiments, the sensing region (120) detects inputs involving contact with an input surface (e.g., a touch screen) of the input device (100) coupled with some amount of applied force or pressure.

The input device (100) may utilize any combination of sensor components and sensing technologies to detect user input in the sensing region (120). The input device (100) includes one or more sensing elements for detecting user input. As several non-limiting examples, the input device (100) may use capacitive, elastive, resistive, inductive, magnetic, acoustic, ultrasonic, and/or optical techniques. The input device (100) may also include one or more physical or virtual buttons (130) to collect user input.

In some embodiments, the input device (100) may utilize capacitive sensing technologies to detect user input. For example, the sensing region (120) may input one or more capacitive sensing elements (e.g., sensor electrodes) to create an electric field. The input device (100) may detect inputs based on changes in the capacitance of the sensor electrodes. More specifically, an object in contact with (or in close proximity to) the electric field may cause changes in the voltage and/or current in the sensor electrodes. Such changes in voltage and/or current may be detected as "signals" indicative of user input. The sensor electrodes may be arranged in arrays or other regular or irregular patterns of capacitive sensing elements to create electric fields. In some implementations, some sensing elements may be ohmically shorted together to form larger sensor electrodes. Some capacitive sensing technologies may utilize resistive sheets that provide a uniform layer of resistance.

Some capacitive sensing technologies may be based on "self capacitance" (also referred to as "absolute capacitance") and/or mutual capacitance (also referred to as "transcapacitance"). Absolute capacitance sensing methods detect changes in the capacitive coupling between sensor electrodes and an input object. Transcapacitance sensing methods detect changes in the capacitive coupling between sensor electrodes. For example, an input object near the sensor electrodes may alter the electric field between the sensor electrodes, thus changing the measured capacitive coupling of the sensor electrodes. In some embodiments, the input device (100) may implement transcapacitance sensing by detecting the capacitive coupling between one or more transmitter sensor electrodes (also "transmitter electrodes" or "transmitter") and one or more receiver sensor electrodes (also "receiver electrodes" or "receiver"). The resulting signal received by a receiver electrode may be affected by environmental interference (e.g., other electromagnetic signals) as well as input objects in contact with, or in close proximity to, the sensor electrodes.

The processing system (110) may be configured to operate the hardware of the input device (100) to detect input in the sensing region (120). The processing system (110) may include parts of, or all of, one or more integrated circuits (ICs) and/or other circuitry components. In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators, etc. For example, the processing system (110) may be part of an integrated touch and display controller.

In some embodiments, the processing system (110) may include determination circuitry (150) configured to determine when at least one input object is in a sensing region, determine signal to noise ratio, determine positional information of an input object, identify a gesture, determine an action to perform based on the gesture, a combination of gestures or other information, and/or perform other operations. In some embodiments, the processing system (110) may include sensor circuitry (160) configured to drive the sensing elements to transmit transmitter signals and receive the resulting signals. In some embodiments, the sensor circuitry (160) may include sensory circuitry that is coupled to the sensing elements. The sensory circuitry may include, for example, a transmitter module including transmitter circuitry that is coupled to a transmitting portion of the sensing elements and a receiver module including receiver circuitry coupled to a receiving portion of the sensing elements.

Although FIG. 1 shows only determination circuitry (150) and sensor circuitry (160), alternative or additional circuitry may exist in accordance with one or more embodiments of the disclosure.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g., to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. A baseline is an estimate of the raw measurements of the sensing region when an input object is not present. For example, a capacitive baseline is an estimate of the background capacitance of the sensing region. Each sensing element may have a corresponding individual value in the baseline. As yet further examples, the processing system (110) may determine positional information, recognize inputs as commands, recognize handwriting, and the like.

In some embodiments, the input device (100) includes a touch screen interface, and the sensing region (120) overlaps at least part of an active area of a display screen (155). The input device (100) may include substantially transparent sensor electrodes overlaying the display screen (155) and provide a touch screen interface for the associated electronic system. The display screen may be any type of dynamic display screen capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen (155) may be operated in part or in total by the processing system (110).

The sensing region (120) and the display screen (155) may be integrated and follow on-cell or in-cell or hybrid architectures. In other words, display screen (155) may be composed of multiple layers (e.g., one or more polarizer layers, color filter layers, color filter glass layers, thin film transistor (TFT) circuit layers, liquid crystal material layers, TFT glass layers, etc.). The sensor electrodes may be disposed on one or more of the layers. For example, the sensor electrodes may be disposed on the TFT glass layer and/or the color filter glass layer. Moreover, the processing system (110) may be part of an integrated touch and display controller that operates both the display functions and the touch sensing functions.

Although not shown in FIG. 1, the processing system, the input device, and/or the host system may include one or more computer processor(s), associated memory (e.g., random access memory (RAM), cache memory, flash memory, etc.), one or more storage device(s) (e.g., a hard disk, an optical drive such as a compact disk (CD) drive or digital versatile disk (DVD) drive, a flash memory stick, etc.), and numerous other elements and functionalities. The computer processor(s) may be an integrated circuit for processing instructions. For example, the computer processor(s) may be one or more cores or micro-cores of a processor. Further, one or more elements of one or more embodiments may be located at a remote location and connected to the other elements over a network. Further, embodiments may be implemented on a distributed system having several nodes, where each portion of the disclosure may be located on a different node within the distributed system. In one embodiment, the node corresponds to a distinct computing device. Alternatively, the node may correspond to a computer processor with associated physical memory. The node may alternatively correspond to a computer processor or micro-core of a computer processor with shared memory and/or resources.

While FIG. 1 shows a configuration of components, other configurations may be used without departing from the scope of the disclosure. For example, various components may be combined to create a single component. As another example, the functionality performed by a single component may be performed by two or more components.

Figure 2A:
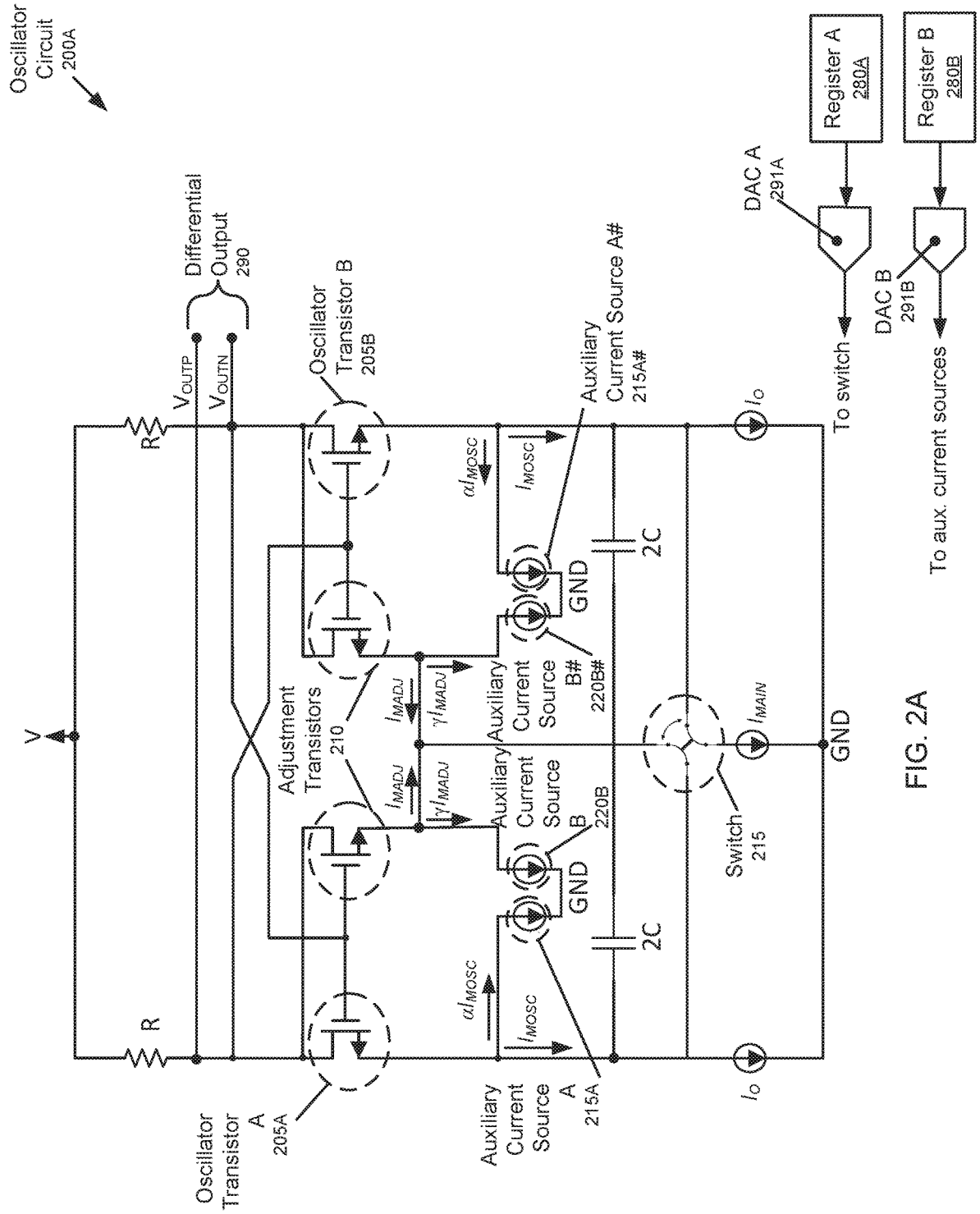
FIG. 2A and FIG. 2B show oscillator circuits in accordance with one or more embodiments.

FIG. 2A shows oscillator circuit A (200A) in accordance with one or more embodiments. As shown in FIG. 2A, oscillator circuit A (200A) has a differential output (290). This differential output (290) has an oscillation frequency and may be used to form a clock signal that is used to operate other circuitry (not shown). For example, oscillator circuit A (200A) may be part of the processing system (110), discussed above in reference to FIG. 1. Additionally or alternatively, oscillator circuit A (200A) may be located on an integrated touch and display controller that operates both the display functions and the touch sensing functions of an input device (e.g., touch screen). Oscillator circuit A (200A) may be located in any electronic device.

As shown in FIG. 2A, oscillator circuit A (200A) includes multiple resistors (R), multiple capacitors (2C), multiple oscillator transistors (e.g., oscillator transistor A (205A), oscillator transistor B (205B)), multiple adjustment transistors (210), and multiple fixed current sources $I_O$. The gate and drain of oscillator transistor A (205A) is coupled to the gate and drain, respectively, of one of the adjustment transistors (210). The gate and drain of oscillator transistor B (205B) is coupled to the gate and drain, respectively, of a different one of the adjustment transistors (210).

Oscillator circuit A (200A) also includes a switch (215) and a current source that provides a main current ($I_{MAIN}$). The switch (215) divides the main current ($I_{MAIN}$) into at least two portions: a portion that is driven through the oscillator transistors (205A, 205B); and a remaining portion that is driven through the adjustment transistors (210). The relative sizes of these portions may be changed by adjusting the switch (215). The oscillation frequency of the differential output (290) depends, at least in part, on the size of the current driven through the oscillator transistors (205A, 205B). Accordingly, the oscillation frequency of the differential output (290) can be changed by adjusting the switch (215).

A current $I_{MOSC}$ is driven through oscillator transistor A (205A). $I_{MOSC}$ includes a portion of the main current ($I_{MAIN}$), due to the switch (215), and at least part of the fixed current $I_O$. In one or more embodiments, $I_{MOSC}$ is also driven through oscillator transistor B (205B).

A current $I_{MADJ}$ is driven through one of the adjustment transistors (210). $I_{MADJ}$ includes a portion of the main current ($I_{MAIN}$), due to the switch (215), and at least part of the fixed current $I_O$. In one or more embodiments, $I_{MADJ}$ is driven through each of the adjustment transistors (210).

The oscillation frequency ($f_{OSC}$) of the differential output (290) may be expressed as Equation 1:

$$f_{OSC} = \frac{I_{MOSC}}{4RC(I_{MOSC} + I_{MADJ})}$$

In one or more embodiments, oscillator circuit A (200A) has a non-zero temperature coefficient. If the temperature coefficient of an oscillator circuit is non-zero, its oscillation frequency may be affected by ambient temperature changes and thereby drift away from the desired oscillation frequency. As discussed above, the differential output (290) may be used to generate a clock signal for use by other circuits. Accordingly, any changes in the oscillation frequency of the differential output (290) may result in damage and/or undesirable behavior in these other circuits.

In one or more embodiments, the temperature coefficient of oscillator circuit A (200A) may be reduced by placing the oscillator transistors (205A, 205B) in weak inversion mode. In weak inversion mode, the trans-conductance ($g_m$) of each oscillator transistor (205A, 205B) can be expressed as Equation 2:

$$g_m = \frac{I_{MOSC}}{nV_t}$$

where $V_t$ is the thermal voltage and n is the slope factor for the oscillator transistor. Since $g_m$ is inversely proportional to the thermal voltage $V_t$, oscillator circuit A (200A) can utilize a proportional to absolute temperature (PTAT) current as a bias current reference. Therefore, $g_m$ essentially remains proportionally constant over temperature.

Still referring to FIG. 2A, oscillator circuit A (200A) includes auxiliary current source A (215A) and auxiliary current source A # (215A #). These auxiliary currents sources (215A, 215A #) form a set of auxiliary current sources and may be configured to drive additional auxiliary currents (positive or negative) through the oscillator transistors (205A, 205B) to place the oscillator transistors (205A, 205B) in weak inversion mode. This, as discussed above, may reduce the temperature coefficient of the oscillator circuit to allow relatively stable output oscillation frequency over a wide range of temperatures.

In one or more embodiments, auxiliary current source A (215A) drives an auxiliary current of $\alpha I_{MOSC}$ through oscillator transistor A (205A). The magnitude of the auxiliary current ($\alpha I_{MOSC}$) driven by auxiliary current source A (215A) is the product of the fraction α multiplied with $I_{MOSC}$. The fraction a may be positive or negative. This auxiliary current is in addition to the current $\alpha I_{MOSC}$ already driven through oscillator transistor A (205A). In one or more embodiments, the auxiliary current source A # (215A #) also drives an auxiliary current of $\alpha I_{MOSC}$ through oscillator transistor B (205B).

As discussed above, the desired oscillation frequency ($f_{OSC}$) of the differential output (290) is based on at least the current driven through the oscillator transistors (205A, 205B) and the current driven through the adjustment transistors (210). When the auxiliary current sources (215A, 215A #) are not active, the current driven through each oscillator transistor (205A, 205B) may be $I_{MOSC}$. However, when the auxiliary current sources (215A, 215A #) are active, the current driven through each oscillator transistor is $(1+\alpha)I_{MOSC}$. The fraction α may be sufficiently large such that changing $I_{MOSC}$ to $(1+\alpha)I_{MOSC}$ places the oscillator transistors (205A, 205B) in weak inversion mode. However, in view of Equation 1 (discussed above), changing $I_{MOSC}$ to $(1+\alpha)I_{MOSC}$ may cause the oscillation frequency of the differential output (290) to shift.

Still referring to FIG. 2A, oscillator circuit A (200A) includes auxiliary current source B (220B) and auxiliary current source B # (220B #). These auxiliary currents sources (215B, 215B #) form a set of auxiliary current sources and are configured to drive additional auxiliary currents (positive or negative) through the adjustment transistors (210). These additional auxiliary currents are used to maintain the desired oscillation frequency ($f_{OSC}$) in the differential output (290) despite auxiliary current source A (215A) and auxiliary current source A # (215A #) being active.

In one or more embodiments, auxiliary current source B (215B) drives an auxiliary current of $\gamma I_{MADJ}$ through one of the adjustment transistors (210). The magnitude of the auxiliary current driven by auxiliary current source B (215B) is the product of the fraction γ multiplied with $I_{MADJ}$. The fraction γ may be positive or negative. This auxiliary current is in addition to the current $I_{MADJ}$ already driven through the adjustment transistor. In one or more embodiments, the auxiliary current source B # (215B #) also drives an auxiliary current of $\gamma I_{MADJ}$ through the other one of the adjustment transistors (210).

In one or more embodiments, taking into consideration the auxiliary currents, the oscillation frequency ($f_{OSC}$) of the differential output (290) may be expressed as Equation 3:

$$f_{OSC} = \frac{(1+\alpha)I_{MOSC}}{4RC((1+\alpha)I_{MOSC} + (1+\gamma)I_{MADJ})}$$

The fraction γ may be sufficiently large such that changing $I_{MADJ}$ to $(1+\gamma)I_{MADJ}$ offsets any shift in oscillation frequency resulting from increasing $I_{MOSC}$ to $(1+\alpha)I_{MOSC}$. In one or more embodiments, by setting α=γ, for example, it is possible to both place the oscillator transistors (205A, 205B) in weak inversion mode and reduce the temperature coefficient of oscillator circuit A (200A), while maintaining the previously set oscillation frequency ($f_{OSC}$). In one or more embodiments, α and γ may be different to account for manufacturing variances in the oscillator transistors (205A, 205B) and/or the adjustment transistors (210).

In one or more embodiments, oscillator circuit A (200A) includes one or more registers (e.g., register A (280A), register B (280B)) each coupled to a digital-to-analog converter (DAC) (e.g., DAC A (291A), DAC B (291B)). Each register (280A, 280B) may be 4 bits wide. Additionally or alternatively, each register (280A, 280B) may be any number of bits wide. One or more software applications may write values to the registers (280A, 280B) and read values from the registers (280A, 280B).

In one or more embodiments, the value stored in register A (280A) may control the switch (215) and thus control the ratio or the amount of the main current ($I_{MAIN}$) driven through the oscillator transistors (205A, 205B) versus the adjustment transistors (210). As discussed above, this is how the oscillation frequency $f_{OSC}$ of the differential output (290) may be set. In this embodiment, register A (280A) may be coupled to the switch (215) via DAC A (291A). Increasing the width of register A (280A) may allow for greater precision when dividing the main current ($I_{MAIN}$). Additionally or alternatively, the switch (215), and thus the oscillation frequency, may be controlled by other digital circuits (e.g., processors, microprocessors, controllers, microcontrollers, etc.) and/or analog circuits (not shown).

In one or more embodiments, the value stored in register B (280B) may control the auxiliary currents driven by auxiliary current source A (215A) and auxiliary current source A # (215A #). In other words, register B (280B) may be used to set fraction a which, as discussed above, can place the oscillator transistors (205A, 205B) in weak inversion mode. In this embodiment, DAC B (291B) couples register B (280B) to auxiliary current source A (215A) and auxiliary current source A # (215A #). Increasing the width of register B (280B) may allow for greater precision when setting the value of α. Additionally or alternatively, the auxiliary current sources (215A, 215A #), and thus the auxiliary currents, may be controlled by other digital circuits (e.g., processors, microprocessors, controllers, microcontrollers, etc.) and/or analog circuits (not shown).

Register B (280B) may also be used to control the auxiliary currents driven by auxiliary current source B (220B) and auxiliary current source B # (220B #). In other words, register B (280B) may be used to set fraction y and maintain the desired oscillation frequency $f_{OSC}$ despite auxiliary current source A (215A) and auxiliary current source A # (215A #) being active. Accordingly, the same DAC (291B) couples register B (280B) to auxiliary current source B (215B) and auxiliary current source B # (215B #).

In one or more embodiments, a separate register (not shown) is used to control the auxiliary currents driven by auxiliary current source B (220B) and auxiliary current source B # (220B #).

Figure 2B:
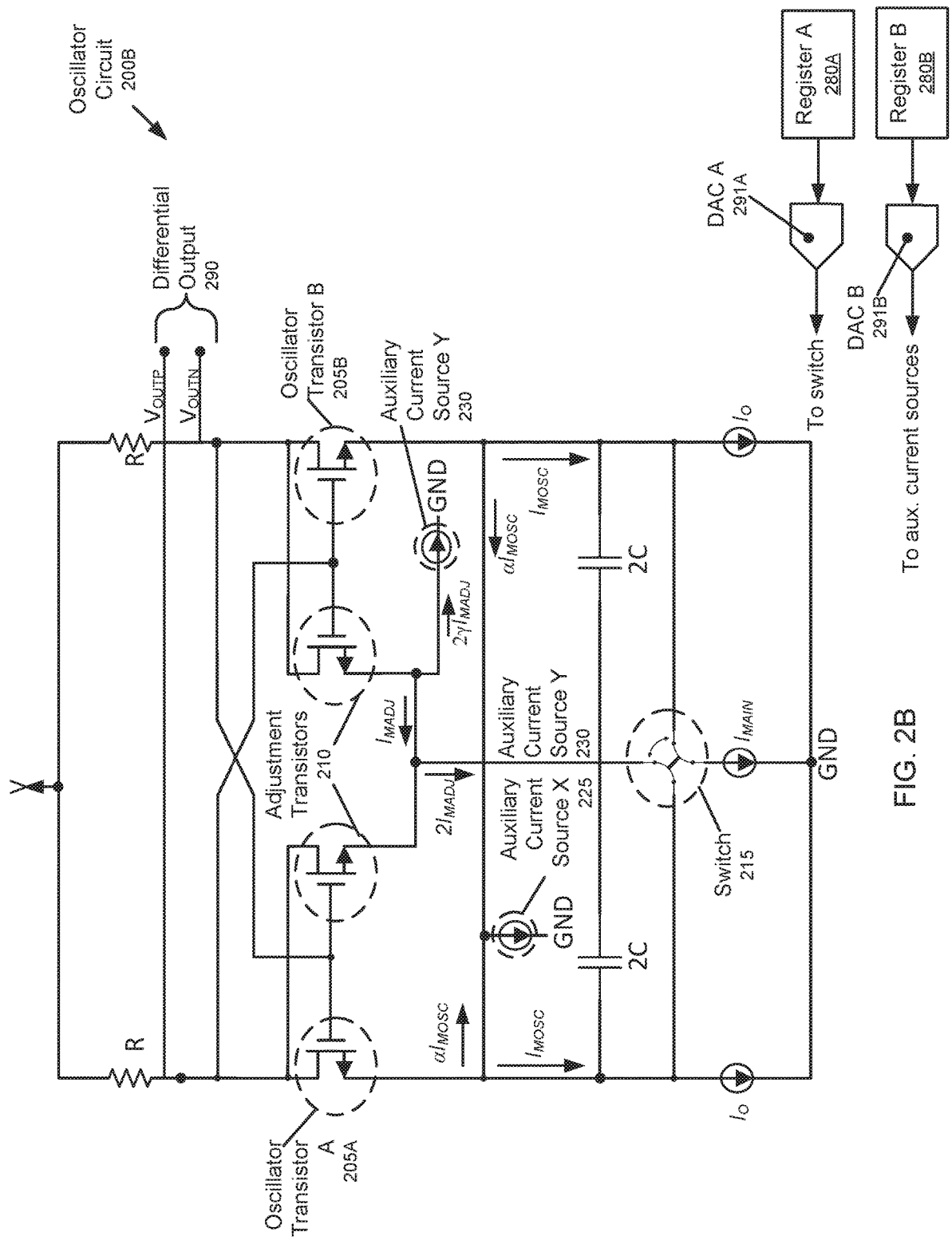

Although FIG. 2A shows all the resistors having the same resistance values and all the capacitors having the same capacitance values, in other embodiments, different resistors may have different resistor values and different capacitors may have different capacitance values. The resistance and capacitance values may need to be different to account for manufacturing variances in the oscillator transistors and/or the adjustment transistors. Further, although FIG. 2A shows all the fixed current sources emitting the same current $I_O$, in other embodiments, different fixed current sources may emit different currents FIG. 2B shows oscillator circuit B (200B) in accordance with one or more embodiments. Similar to oscillator circuit A (200A), oscillator circuit B includes a differential output (290), multiple resistors (R), multiple capacitors (2C), multiple oscillator transistors (e.g., oscillator transistor A (205A), oscillator transistor B (205B)), multiple adjustment transistors (210), multiple fixed current source ($I_O$), a main current ($I_{MAIN}$), and a switch (215).

Similar to oscillator circuit A (200A), in oscillator circuit B (200B) the switch (215) divides the main current ($I_{MAIN}$) into at least two portions: a portion that is driven through the oscillator transistors (205A, 205B); and a portion that is driven through the adjustment transistors (210). Because the oscillation frequency of the differential output (290) depends on at least $I_{MOSC}$, and because switch (215) controls, at least in part, the size $I_{MOSC}$ driven through the oscillator transistors (205A, 205B), the desired oscillation frequency of the differential output (290) can be changed by adjusting the switch (215).

As shown in FIG. 2B, oscillator circuit B (200B) includes an auxiliary current source X (225). A set of auxiliary current sources may include one or more auxiliary current sources (e.g., auxiliary current source X (225)). Auxiliary current source X (225) is configured to drive auxiliary currents through both oscillator transistor A (205A) and oscillator transistor B (205B). Specifically, auxiliary current source X (225) may drive a current of $2\alpha I_{MOSC}$, which is split between the oscillator transistors (205A, 205B). As discussed above in reference to FIG. 2A, auxiliary currents may be driven through the oscillator transistors (205A, 205B) to place the oscillator transistors (205A, 205B) in weak inversion mode. The weak inversion mode enables temperature coefficient reduction of oscillator circuit B (200B).

Still referring to FIG. 2B, oscillator circuit B (200B) includes auxiliary current source Y (230). A set of auxiliary current sources may include one or more auxiliary current sources (e.g., auxiliary current source X (225)). Auxiliary current source Y (230) is configured to drive auxiliary currents through both adjustment transistors (210). Specifically, auxiliary current source Y (230) may drive a current of $2\gamma I_{MADJ}$, which is split between the adjustment transistors (210). As discussed above in reference to FIG. 2A, auxiliary currents may be driven through the adjustment transistors (210) to maintain the differential output (290) at the desired oscillation frequency ($f_{OSC}$) even though auxiliary current source X (225) may be active and driving additional auxiliary currents through the oscillator transistors (205A, 205B).

Oscillator circuit B (200B) may include one or more registers (e.g., register A (280A), register B (280B)) each coupled to a digital-to-analog converter (DAC) (e.g., DAC A (291A), DAC B (291B)), similar to that of oscillator circuit A (200A) discussed above. Each register (280A, 280B) may be 4 bits wide. One or more software applications may write values to the registers (280A, 280B) and read values from the registers (280A, 280B). Moreover, as discussed above in reference to FIG. 2A, these registers (280A, 280B) and DACs (DAC A (291A), DAC B (291B)) may be used to set the oscillation frequency of the differential output (290) and the values for fraction α and fraction γ.

Figure 3A:
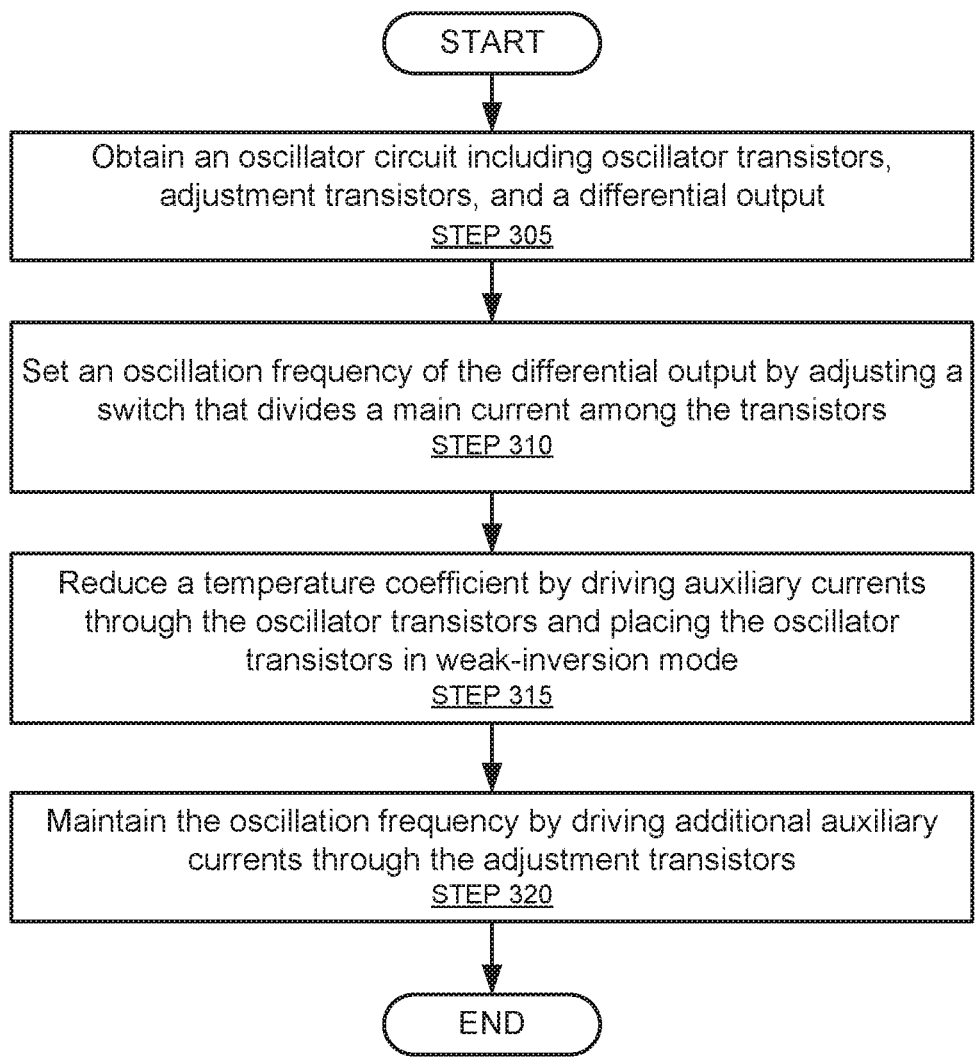
FIG. 3A and FIG. 3B show flow charts in accordance with one or more embodiments.

FIG. 3A shows a flowchart in accordance with one or more embodiments. The flowchart of FIG. 3A depicts a method for operating an oscillator circuit (e.g., oscillator circuit A (200A), oscillator circuit B (200B)). One or more of the steps in FIG. 3A may be performed by the components of the oscillator circuits (200A, 200B), discussed above in reference to FIG. 2A and FIG. 2B. In one or more embodiments, one or more of the steps shown in FIG. 3A may be omitted, repeated, and/or performed in a different order than the order shown in FIG. 3A. Accordingly, the scope of the invention should not be considered limited to the specific arrangement of steps shown in FIG. 3A.

Initially, an oscillator circuit is obtained (STEP 305). The oscillator circuit includes multiple resistors (R), multiple capacitors (2C), multiple oscillator transistors, and multiple adjustment transistors coupled to the gates and drains of the multiple oscillator transistors. Further, the oscillator circuit includes multiple sets of auxiliary current sources coupled to the oscillator transistors and adjustment transistors. Further still, the oscillator circuit also includes a differential output. The differential output may be used to generate a clock signal for other circuits.

In STEP 310, the oscillation frequency of the differential output is set. The oscillation frequency of the differential output may depend on, at least, the portion of a main current driven through the oscillator transistors vs. the portion of the main current driven through the adjustment transistors. Accordingly, the desired oscillation frequency of the differential output can be obtained by adjusting a switch. For example, the switch may be configured to control how the main current is divided among the oscillator transistors and the adjustment transistors. In one or more embodiments, adjusting the switch includes writing a value to a register that controls the switch, discussed above in reference to FIG. 2A.

$I_{MOSC}$ and $I_{MADJ}$ are the currents driven through each oscillator transistor and each adjustment transistor, respectively, as a result of the switch. The oscillating frequency ($f_{OSC}$) of the differential output may be expressed as Equation 1:

$$f_{OSC} = \frac{I_{MOSC}}{4RC(I_{MOSC} + I_{MADJ})}$$

In STEP 315, the temperature coefficient of the oscillator circuit is reduced. As discussed above, this reduces drifting in the oscillation frequency of the differential output if the ambient temperature changes. Reducing the temperature coefficient may include activating a set of auxiliary current sources (i.e., one or more auxiliary current sources) to drive auxiliary currents through the oscillator transistors and place the oscillator transistors in weak inversion mode. Specifically, an auxiliary current of $\alpha I_{MOSC}$ may be driven through each of the oscillator transistors. This is in addition to $I_{MOSC}$ already being driven through each of the oscillator transistors as a result of the main current and the switch. However, in view of equation 1, adjusting $I_{MOSC}$ to $(1+\alpha)I_{MOSC}$ may cause the oscillation frequency of the differential output to drift.

In STEP 320, the desired oscillation frequency ($f_{OSC}$) of the differential output is maintained. This includes activating a set of auxiliary current sources (i.e., one or more auxiliary current sources) to drive auxiliary currents through the adjustment transistors. Specifically, an auxiliary current of $\gamma I_{MADJ}$ may be driven though each adjustment transistor. This is in addition to $I_{MADJ}$ already being driven through each of the adjustment transistors as a result of the main current and the switch.

In one or more embodiments, taking into consideration the auxiliary currents, the oscillating frequency ($f_{OSC}$) of the differential output may be expressed as:

$$f_{OSC} = \frac{(1+\alpha)I_{MOSC}}{4RC((1+\alpha)I_{MOSC} + (1+\gamma)I_{MADJ})}$$

In one or more embodiments, by setting α=γ, it is possible to both place the oscillator transistors in weak inversion mode and reduce the temperature coefficient of the oscillator circuit, while maintaining the previously set oscillation frequency ($f_{OSC}$). In one or more embodiments, α and γ are different to account for manufacturing variances in the oscillator transistors and/or the adjustment transistors. In one or more embodiments, setting α and γ includes writing to one or more registers that control the auxiliary current sources.

Figure 3B:
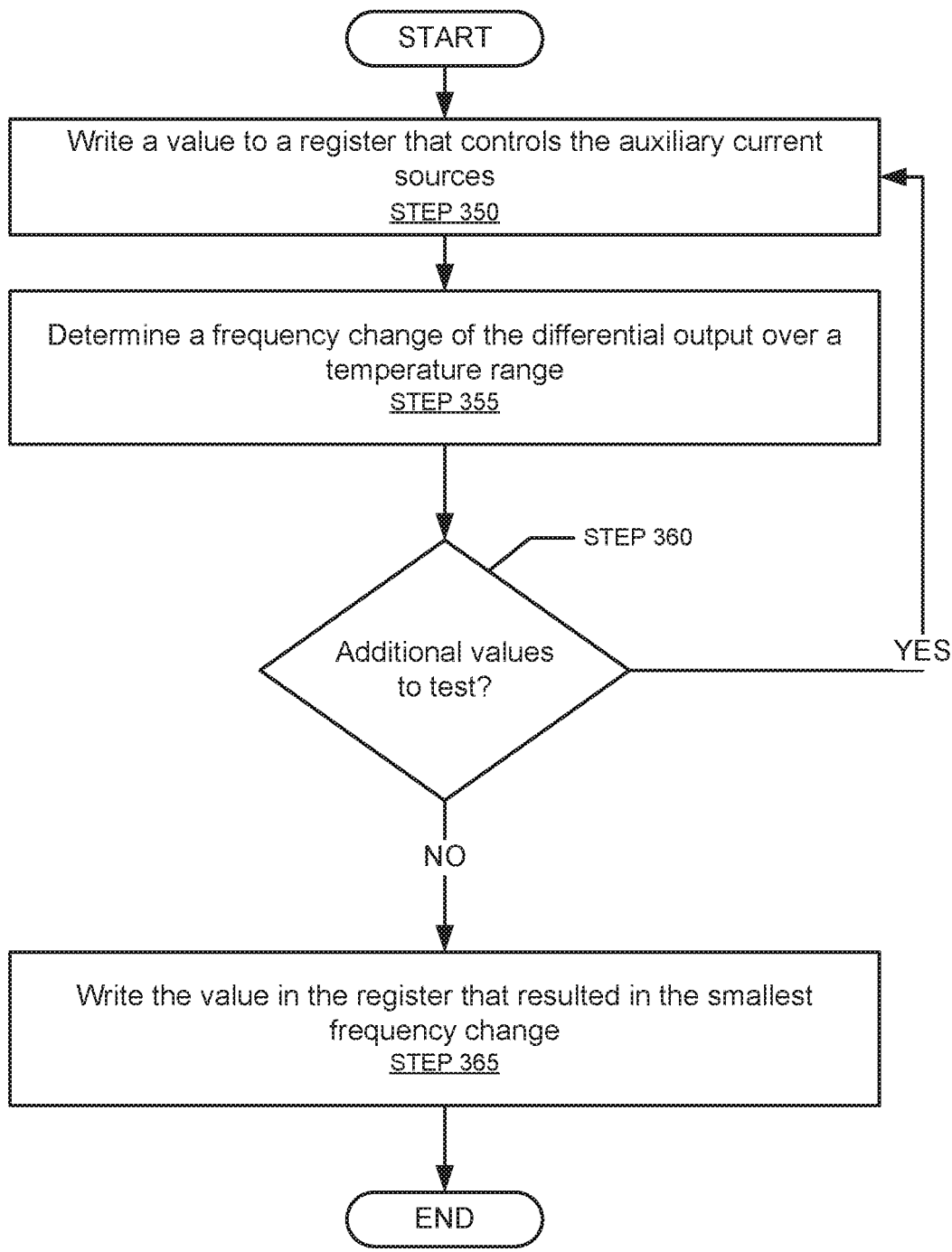

FIG. 3B shows a flowchart in accordance with one or more embodiments. The flowchart of FIG. 3B depicts a method for operating an oscillator circuit (e.g., oscillator circuit A (200A), oscillator circuit B (200B)). Specifically, the process depicted in FIG. 3B may correspond to STEP 315 and/or STEP 320 in FIG. 3A. One or more of the steps in FIG. 3B may be performed by the components of the oscillator circuits (200A, 200B), discussed above in reference to FIG. 2A and FIG. 2B. In one or more embodiments, one or more of the steps shown in FIG. 3B may be omitted, repeated, and/or performed in a different order than the order shown in FIG. 3B. Accordingly, the scope of the invention should not be considered limited to the specific arrangement of steps shown in FIG. 3B.

Initially, a value(s) is written to a register(s) that controls the auxiliary current sources (STEP 350). For example, the register may be coupled to the auxiliary current sources by a digital-to-analog converter (DAC). The value(s) is effectively used to set α and γ.

In STEP 355, a change in the oscillating frequency of the differential output is determined. This may include operating the oscillator circuit at various ambient temperatures with the set α and γ, and then measuring the drift from the desired oscillation frequency. If the additional auxiliary currents have successfully placed the oscillator transistors in weak inversion mode, there will be little change to the oscillation frequency of the differential output, despite the changes in ambient temperature.

In STEP 360, it is determined if there are additional values to test. In other words, it is determined if there are additional values (corresponding to additional values of α and γ) to write to the register(s). When it is determined that additional values remain, the process returns to STEP 350. Otherwise, the process proceeds to STEP 365.

In STEP 365, the value(s) that resulted in the smallest frequency change is written to the register(s). In one or more embodiments, this value(s) corresponds to the ideal settings for α and γ. This value may be written to the registers of other oscillator circuits. In one or more embodiments, the circuitry inputting a clock signal that is based on the oscillation frequency of the differential output may now be activated.

Thus, the embodiments and examples set forth herein were presented in order to best explain various embodiments and their particular application(s) and to thereby enable those skilled in the art to make and use the embodiments. However, those skilled in the art will recognize that the foregoing description and examples have been presented for the purposes of illustration and example only. The description as set forth is not intended to be exhaustive or to be limiting to the precise form disclosed.

While many embodiments have been described, those skilled in the art, having benefit of this disclosure, will appreciate that other embodiments can be devised which do not depart from the scope. Accordingly, the scope of the invention should be limited only by the attached claims.

What is claimed is:

1. An oscillator circuit, comprising:
a plurality of oscillator transistors comprising a plurality of gates;
a plurality of adjustment transistors coupled to the plurality of gates;
a differential output coupled to the plurality of oscillator transistors;
a switch configured to set an oscillation frequency of the differential output by driving:
a first current comprising a first portion of a main current through at least one of the plurality of oscillator transistors; and
a second current comprising a second portion of the main current through at least one of the plurality of adjustment transistors;
a first set of auxiliary current sources configured to adjust a temperature coefficient of the oscillator circuit by driving a first set of auxiliary currents through the plurality of oscillator transistors; and
a second set of auxiliary current sources configured to maintain the oscillation frequency of the differential output by driving, in response to driving the first set of auxiliary currents, a second set of auxiliary currents though the plurality of adjustment transistors.

2. The oscillator circuit of claim 1, wherein each of the first set of auxiliary currents has a magnitude equaling a first product of a fraction multiplied by the first current.

3. The oscillator circuit of claim 2, wherein the first set of auxiliary current sources comprises a single current source that drives current having a magnitude equal to twice the first product.

4. The oscillator circuit of claim 2, wherein each of the second set of auxiliary currents has a magnitude equaling a second product of the fraction multiplied by the second current.

5. The oscillator circuit of claim 4, wherein the second set of auxiliary current sources comprises a single current source that drives current having a magnitude equal to twice the second product.

6. The oscillator circuit of claim 1, further comprising:
a first register configured to store a first value to control the first set of auxiliary currents; and
a first digital-to-analog converter (DAC) coupling the first register to the first set of auxiliary current sources.

7. The oscillator circuit of claim 6, wherein the first value also controls the second set of current sources, and wherein the first DAC also couples the first register to the second set of auxiliary current sources.

8. The oscillator circuit of claim 6, further comprising:
a second register configured to store a second value to control the switch; and
a second DAC coupling the second register with the switch.

9. A method for operating an oscillator circuit, comprising:
setting an oscillation frequency of a differential output by adjusting a switch that drives:
a first current comprising a first portion of a main current through at least one of a plurality of oscillator transistors; and
a second current comprising a second portion of the main current through at least one of a plurality of adjustment transistors;
adjusting a temperature coefficient of the oscillator circuit by driving a first set of auxiliary currents through the plurality of oscillator transistors; and
maintaining the oscillation frequency of the differential output by driving, in response to driving the first set of auxiliary currents, a second set of auxiliary currents though the plurality of adjustment transistors.

10. The method of claim 9, wherein:
each of the first set of auxiliary currents has a magnitude equaling a first product of a fraction multiplied by the first current; and
each of the second set of auxiliary currents has a magnitude equaling a second product of the fraction multiplied by the second current.

11. The method of claim 10, wherein:
the first set of auxiliary currents are driven by a single current source that drives current having a magnitude equal to twice the first product; and
the second set of auxiliary currents are driven by a single current source that drives current having a magnitude equal to twice the second product.

12. The method of claim 9, further comprising:
writing a first value to a register that controls the first set of auxiliary currents;
determining a first frequency change of the differential output over a temperature range;
writing a second value to the register; and
determining a second frequency change of the differential output over the temperature range,
wherein the second frequency change is less than the first frequency change.

13. The method of claim 12, wherein the register also controls the second set of auxiliary currents.

14. The method of claim 9, wherein setting the oscillation frequency of the differential output comprises:
setting the main current; and
writing a value to a register that controls the switch,
wherein the switch and the register are coupled by a digital-to-analog converter (DAC).

15. An input device, comprising:
an oscillator circuit comprising:
a plurality of oscillator transistors comprising a plurality of gates;
a plurality of adjustment transistors coupled to the plurality of gates;
a differential output coupled to the plurality of oscillator transistors;
a switch configured to set an oscillation frequency of the differential output by driving:
a first current comprising a first portion of a main current through at least one of the plurality of oscillator transistors; and a second current comprising a second portion of the main current through at least one of the plurality of adjustment transistors;

a first set of auxiliary current sources configured to adjust a temperature coefficient of the oscillator circuit by driving a first set of auxiliary currents through the plurality of oscillator transistors; and a second set of auxiliary current sources configured to maintain the oscillation frequency of the differential output by driving, in response to driving the first set of auxiliary currents, a second set of auxiliary currents though the plurality of adjustment transistors; and circuitry configured to operate, based on at least the differential output of the oscillator circuit, a plurality of sensor electrodes during capacitive sensing.

16. The input device of claim 15, wherein the circuitry is located on an integrated touch and display controller, and wherein the plurality of sensor electrodes are disposed on a thin film transistor (TFT) glass layer, a color filter glass layer, or a combination thereof.

17. The input device of claim 15, wherein each of the first set of auxiliary currents has a magnitude equaling a first product of a fraction multiplied by the first current.

18. The input device of claim 17, wherein the first set of auxiliary current sources comprises a single current source that drives current having a magnitude equal to twice the first product.

19. The input device of claim 17, wherein:

each of the second set of auxiliary currents has a magnitude equaling a second product of the fraction multiplied by the second current; and the second set of auxiliary current sources comprises a single current source that drives current having a magnitude equal to twice the second product.

20. The input device of claim 15, wherein the oscillator circuit further comprises:

a register configured to store a first value to control the first set of auxiliary currents and to control the second set of auxiliary currents; and a digital-to-analog converter (DAC) coupling the register to the first set of auxiliary current sources and to the second set of auxiliary current sources.

* * * * *

UNITED STATES PATENT AND TRADEMARK OFFICE
CERTIFICATE OF CORRECTION

PATENT NO. : 10,530,296 B2  
APPLICATION NO. : 15/885769  
DATED : January 7, 2020  
INVENTOR(S) : Andrew Jabrucki et al.

Page 1 of 1

It is certified that error appears in the above-identified patent and that said Letters Patent is hereby corrected as shown below:

On the Title Page

Item (57) ABSTRACT, occurring on the sixteenth line, the word "though" should read -- through --.

In the Claims

Claim 1, Column 13, at the beginning of Line 43, the word "though" should read -- through --.

Claim 9, Column 14, at the beginning of Line 22, the word "though" should read -- through --.

Claim 15, Column 15, Line 12, the word "though" should read -- through --.

Signed and Sealed this  
Second Day of June, 2020

Andrei Iancu  
*Director of the United States Patent and Trademark Office*